United States Patent [19]

Rayburn

[11] Patent Number: 4,648,006
[45] Date of Patent: Mar. 3, 1987

[54] PLASTIC CHIP CAPACITOR FOR SURFACE MOUNTING

[75] Inventor: Charles C. Rayburn, Lynchburg, Va.

[73] Assignee: Illinois Tool Works Inc., Chicago, Ill.

[21] Appl. No.: 716,013

[22] Filed: Mar. 26, 1985

[51] Int. Cl.[4] .......................... H01G 1/14; H01R 9/00
[52] U.S. Cl. .................................... 361/309; 361/405
[58] Field of Search .............. 361/402, 404, 405, 308, 361/309, 310, 321 C, 433 C, 273

[56] References Cited

U.S. PATENT DOCUMENTS

| | | | |
|---|---|---|---|
| 3,148,315 | 9/1964 | Rondeau et al. | 361/273 X |
| 3,550,228 | 12/1970 | Asscher | 361/405 X |
| 3,551,873 | 12/1970 | Weyenberg | 361/405 X |
| 3,612,963 | 10/1971 | Piper et al. | 361/321 C |
| 3,665,267 | 5/1972 | Acello | 361/309 |
| 3,710,211 | 1/1973 | Behn et al. | 361/309 |
| 3,766,451 | 10/1973 | Voda et al. | 361/309 |
| 3,818,279 | 6/1974 | Seeger et al. | 361/321 C X |
| 4,190,878 | 2/1980 | Förster | 361/273 X |
| 4,458,294 | 7/1984 | Womack | 361/321 C |
| 4,494,169 | 1/1985 | Watson | 361/433 C X |

Primary Examiner—Donald A. Griffin
Attorney, Agent, or Firm—Donald D. Mondul; Thomas W. Buckman

[57] ABSTRACT

An improved metallized film capacitor configured for surface mounting to a substrate, which capacitor has a capacitive structure electrically terminated at a first end by a first electrical termination and electrically terminated at a second end by a second electrical termination and has at least one lateral face intermediate the first and second ends. The improvement comprises extension of each of the first and second electrical terminations from their respective ends onto the at least one lateral face of the capacitor and in that extension providing sufficient thickness to the electrical termination extensions to establish a gap between the at least one lateral face and a substrate when the capacitor is surface mounted to the substrate by the electrical terminations, the gap being sufficient to facilitate cleaning contaminants from between the lateral face of the capacitor and the substrate after the capacitor is mounted to the substrate.

7 Claims, 3 Drawing Figures

PLASTIC CHIP CAPACITOR FOR SURFACE MOUNTING

BACKGROUND OF THE INVENTION

The present invention is directed to a polymer film dielectric capacitor configured for surface mounting to a substrate in an electronic circuit.

As the technology of surface mounting electronic components to substrates continues to gain acceptance in today's marketplace and continues to find preference over through-hole circuit board assembly, ceramic multi-layer capacitors are increasing in popularity at the expense of polymer dielectric capacitors.

Ceramic multi-layer capacitors, if not thermally shocked, will withstand high temperature solder assembly techniques to substrates. In such high temperature solder assembly situations, a ceramic multi-layer capacitor's value will shift upward with the temperature rise during soldering and then exponentially decay over a period of days with the rate of decay depending upon the specific ceramic body involved. Ceramic capacitors, since they are subjected to extremely high temperatures during their manufacture, do not require an insulated overcoat to protect them thermally so that they are small and their cost is kept low.

The present configuration of ceramic capacitors as they are adapted for surface mounting applications in the electronics industry has distinct shortcomings. One such shortcoming is the electrical terminal connection points presently used with ceramic multi-layer capacitors in surface mounted applications.

Presently available ceramic multi-layer capacitors configured for surface mounting applications have terminal arrangements which, when the capacitor is in assembled relation with a substrate upon which it is mounted, maintain the body of the capacitor only slightly above the level of the substrate itself.

This arrangement causes at least two major problems: First, the extremely narrow gap between the body of the capacitor and the substrate to which it is mounted makes it very difficult to flush out contaminants such as solder flux and the like which commonly accumulate during processing of electronic circuits in production volume operations. Second, and closely allied with the difficulty in flushing contaminants from between the capacitor body and substrate, is the problem that since the contaminants are generally inadequately flushed and therefore remain trapped between the capacitor and the substrate, there is thereby provided a leakage path across the capacitor terminals which can severely affect the performance of a capacitor within the circuit in which it is employed.

It is well known in the electronics industry that polymer dielectric capacitors, commonly known as plastic film capacitors, enjoy some important advantages over ceramic multi-layer capacitors. For example, insulation resistance, a measure of the capacitor's resistance to providing a leakage path, is generally higher with plastic film capacitors than with similarly valued and dimensioned ceramic multi-layer capacitors.

Further, the dissipation factor, a factor relating to the dissipation of energy by a capacitor, is generally lower with plastic film capacitors than with similarly valued and dimensioned ceramic multi-layer capacitors.

Of perhaps the greatest importance is the capability of plastic film capacitors to self-heal in the event of a short circuit. Plastic film capacitors are coated with thin metal electrodes (generally aluminum) which electrodes vaporize at a shorted area to instantly clear the short and self-heal. Ceramic multi-layer electrodes are thick film and will not vaporize and clear. As a result, the ceramic multi-layer parts, when shorted, can dissipate a large amount of energy, which energy is sometimes manifested as heat sufficient to start fires within equipment.

Thus, it would be of extreme value to the electronic industry if a plastic film capacitor, with all of its advantages over ceramic multi-layer capacitors, could be produced in a manner to render it compatible with today's surface mounting techniques.

The present invention is directed to an improved metallized film capacitor configured for surface mounting with electrical terminations which, when the capacitor is mounted to a substrate in an electronic circuit, maintain a substantial gap between the capacitor body and the substrate to which it is mounted, on the order of 0.005 inches, which greatly facilitates the flushing of contaminants from between the capacitor body and the substrate after processing, thereby greatly reducing the tendency of trapped contaminants to provide a leakage path across the terminals of the capacitor. The particular configuration disclosed herein has further advantages in that it enhances the physical integrity of the plastic film capacitor.

No presently extant application of plastic film dielectric capacitors to surface mounting techniques is known except for specially packaged, bulky devices incorporating thermally protective encasement techniques such as plastic boxes or bulky wrappings.

Yet a further advantage of the present invention is best understood when considering such prior art attempts to adapt plastic film capacitors to surface mounting applications. Prior art attempts to adapt plastic film capacitors to surface mounting techniques, as hereinabove discussed, involve provision of bulky thermal protection structures and a fairleading of electrical access terminals from the capacitor terminals within the thermally protected package to a point without the thermally protected package to which connection is made in employing the device in an electronic circuit. Typically, such thermally protectively packaged plastic film capacitors are uni-directional in their applicability. That is, such capacitors can only be mounted in a particular attitude and, if that attitude is not presented to the substrate, no effective electrical connection can be made. Such capacitors have a "top" and a "bottom" and if they are, for instance by some automated handling means, presented "upside down" for connection to a substrate in a production assembly operation, no electrical connection may be effected with the capacitor.

The capacitor of the preferred embodiment of the present invention, in contrast, has no "top" or "bottom"; it is multi-directional, and therefore it is more easily handled by automated assembly machinery, which results in a lower cost of manufacture of circuits involving capacitors of the type disclosed herein.

SUMMARY OF THE INVENTION

The invention is an improved metallized film capacitor configured for surface mounting to a substrate, which capacitor has two electrically accessible contacts and at least one lateral face intermediate those two contacts. The improvement exists in extension of each of the electrical termination access areas from the first and second ends of the capacitor onto the lateral face or faces of the capacitor and in that extension providing sufficient thickness to the electrical termination extension to establish a gap between the lateral face or faces of the capacitor and the substrate when the capacitor is surface mounted to the substrate to facilitate cleaning contaminants from between the lateral face or faces and the substrate after such mounting.

Significant savings in cost of manufacture over other surface mountable plastic film capacitors are realized.

Significant operational characteristic improvements such as facilitation of cleansing of contaminants from between a substrate and the capacitor mounted thereon and its consequent reduction of likelihood of leakage paths across the capacitor are advantages of the invention disclosed herein over prior art ceramic multi-layer capacitors.

It is therefore an object of the present invention to provide an improved metallized film capacitor configured for surface mounting to a substrate having electrical termination access pads extending onto lateral faces of the capacitor, which electrical termination pads have sufficient thickness to establish a gap between the capacitor and the substrate to which it is mounted to facilitate cleaning contaminants from between the lateral face and the substrate after the mounting.

It is a further object of the present invention to provide an improved metallized film capacitor configured for surface mounting to a substrate having electrical termination pads applied thereto which extend onto the lateral face or faces of the capacitor in a manner whereby the physical integrity of the capacitor is enhanced by locking the outer layers of the capacitor more firmly in position and thereby increasing their resistance to delamination.

Further objects and features of the present invention will be apparent from the following specification and claims when considered in connection with the accompanying drawings illustrating the preferred embodiment of the invention.

DETAILED DESCRIPTION OF THE DRAWINGS

DETAILED DESCRIPTION OF THE INVENTION

Figure 1:
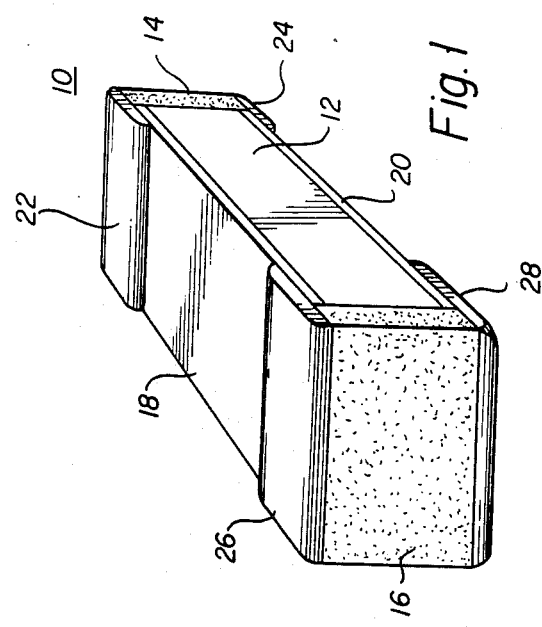
FIG. 1 is a perspective schematic view of the preferred embodiment of the capacitor of the present invention.

Referring to FIG. 1, a plastic film capacitor 10 is illustrated. The capacitor 10 has a parallel plate structure 12 comprised of alternating layers of plastic dielectric film and electrically conductive material (not shown). The parallel plates 12 are connected at a first electrical terminal 14 and a second terminal 16 in a manner creating a capacitive relationship among the parallel plates 12.

In the preferred embodiment of the present invention the parallel plate structure 12 is protected by an additional, relatively thick, top cover plate 18 and bottom cover plate 20, which cover plates 18 and 20 are preferably comprised of plastic material similar in composition to the plastic dielectric film of the parallel plate structure.

According to the preferred embodiment of the present invention, as illustrated in FIG. 1, associated with the first electrical terminal 14 are a top electrical termination pad 22 and a bottom electrical termination pad 24. Similarly associated with the second electrical terminal 16 are a top electrical terminal pad 26 and a bottom electrical terminal pad 28.

In the preferred embodiment of the present invention, the parallel plate structure 12 is comprised of plastic film material having deposited thereon a thin film of aluminum.

In order that there be no dissimilar metal coupling between the electrical terminals 14 and 16 and the metallized film of the parallel plate structure 12, it is preferrable that the electrical terminals 14 and 16 be comprised of aluminum as well.

Aluminum is not respective to solder and therefore prior art devices have accomplished attachment of solderable leads to the electrical terminals such as 14 and 16 of FIG. 1 in order to facilitate soldering connection of the capacitor within an electronic circuit. However, the invention herein disclosed is intended for surface mounting (leadless mounting) within electronic circuits. Therefore, the electrical terminal pads 22, 24, 26 and 28 are added, generally by a spraying technique, in order to provide leadless solderable access to the parallel plate structure 12 of the capacitor via electrical terminals 14 and 16.

Thus, for example, electrical terminal pads 22 and 26 are sprayed copper applied to the top of the capacitor 10. Electrical terminal pad 22 spans electrical terminal 14 and a portion of top cover plate 18; electrical terminal pad 26 spans electrical terminal 16 and a portion of top cover plate 18. Similarly, electrical terminal pad 24 spans electrical terminal 14 and a portion of bottom cover plate 20; electrical terminal pad 28 spans electrical terminal 16 and a portion of bottom cover plate 20.

In the preferred embodiment, the electrical terminal pads 22, 24, 26 and 28 are comprised of copper and are applied by hot spraying techniques generally known in the electronics industry. A beneficial consequence of this hot spraying application technique and the positioning of electrical terminal pads 22, 24, 26 and 28 spanning an electrical terminal 14, 16 and extending onto a cover plate 18 or 20, is that when the hot copper particles strike the cover plate they become partially embedded in the cover plate, providing a firm bond between the copper and the cover plate. The aluminum spray material which comprises the electrical terminals 14 and 16 is porous in its final form and consequently the spray copper infiltrates well within the porous aluminum and provides the electrical terminal pads 22, 24, 26 or 28 a firm bond with the aluminum porous material of the electrical terminals 14 and 16 as well. Thus, each respective electrical terminal pad 22, 24, 26 and 28 is firmly anchored both to its respective terminal 14 or 16 and to its respective cover plate 18 or 20. This firm bonding spanning relationship among the cover plates 18 and 20 and the electrical terminals 14 and 16 significantly enhances the physical integrity of the capacitor 10 and its resistance to delamination.

In FIG. 1, the preferred embodiment is illustrated wherein the electrical terminal pads 22, 24, 26 and 28 do not cover the end faces of the electrical terminals 14 and 16 so that in surface mounting the solder adhesion of the capacitor to the substrate to which it is mounted will be concentrated on the two electrical terminal pads (22 and 26 or 24 and 28) by which it contacts circuit traces on that substrate. Of course, the electrical terminal pads 22 and 24 could be extended to meet and cover the end face of electrical terminal 14 and the electrical terminal pads 26 and 28 could be extended to meet and cover the end face of electrical terminal 16.

While the materials suggested for the preferred embodiment of the invention hereinabove include aluminum and copper, certainly other materials known in the art to have appropriate properties for establishment of capacitive structure and solderability could as well be used.

Figure 3:
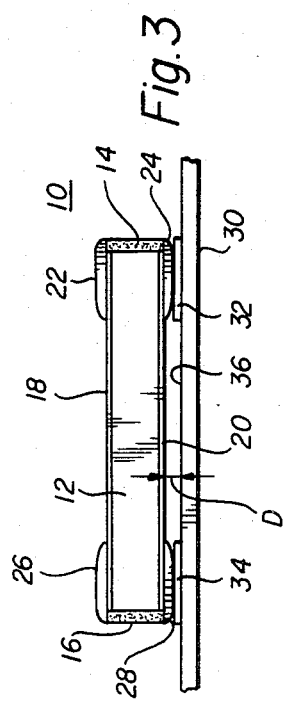
FIG. 3 is a side schematic view of the preferred embodiment of the invention installed upon a substrate.

A significant feature of the structure illustrated in FIG. 1 and comtemplated by this disclosure is illustrated in FIG. 3. FIG. 3 illustrates in side schematic view the installation of a capacitor 10 upon a substrate 30.

For purposes of clarity of understanding the invention, like elements will be given the same reference numeral in the various views incorporating those elements.

In FIG. 3 the capacitor 10 is mounted upon the substrate 30 by electrical terminal pads 24 and 28 making electrical connection respectively to substrate pads 32 and 34. Substrate pads 32 and 34 are intended to represent connection points within circuitry (not shown) carried upon the substrate 30. A significant structural feature of the present invention, best illustrated by FIG. 3, is the fact that when the capacitor 10 is mounted upon the substrate 30 by its substrate pads 32 and 34 and the capacitor's electrical termination pads 24 and 28, the capacitor clears the top 36 of the substrate 30 by a distance D established between the top 36 of the substrate 30 and the bottom plate 20 of the capacitor 10.

In the preferred embodiment of the present invention, the distance D between the top 36 of the substrate 30 and the bottom cover plate 20 of the capacitor 10 is on the order of 0.005 inches; that distance is significantly greater than is presently available with either ceramic or other plastic film surface mounted type capacitive devices and serves to greatly facilitate the flushing of contaminants from between the capacitor 10 and the substrate 30 after the capacitor 10 is mounted by surface mounting means upon the substrate 30. Failure to adequately flush such contaminants, which may be solder flux or the like, from between the capacitor 10 and the substrate 30 provides an opportunity for a leakage path to be established across the substrate pads 32 and 34, thereby shorting out the capacitor 10 and rendering the electronic circuit in which it is employed inoperable.

Figure 2:
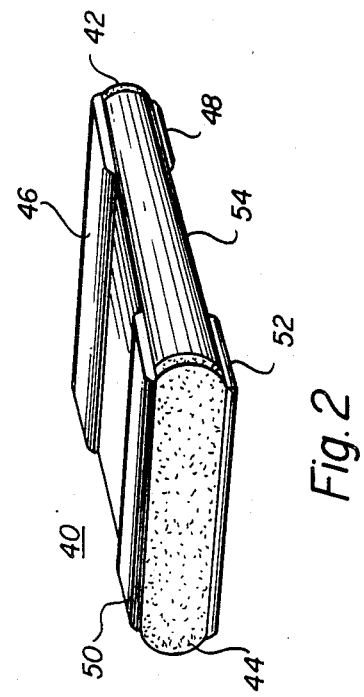
FIG. 2 is a perspective schematic drawing of an alternate embodiment of the capacitor of the present invention.

Referring to FIG. 2, an alternate embodiment of the present invention is illustrated wherein there is a capacitor 40. The capacitor 40 of FIG. 2 is contemplated to be a plastic film dielectric capacitor of the type wherein the plates of the capacitor are formed by concentric winding upon a mandrel or by similar means so that a substantially cylindrical capacitor is formed. The substantially cylindrical capacitor is then flattened to the ovate cross-sectioned shape illustrated in FIG. 2. The capacitor 40 is then coated at its ends with electrical terminals 42 and 44 and thereafter electrical terminal pads 46, 48, 50 and 52 are applied to span the electrical terminals 42 and 44 and extend onto a portion of lateral face 54 of the capacitor 40.

For the same reasons are hereinbefore recited with regard to FIG. 1, the electrical terminals 42 and 44 are preferably of aluminum in order that no dissimilar metal reaction will occur between the electrical terminals 42 and 44 and the electrical plate material of the plate structure of the capacitor 40. Similarly, the electrical terminal pads 46, 48, 50 and 52 are preferrably comprised of copper which is hot spray applied in order that the hot copper material will embed itself into the material of lateral face 54 and infiltrate the porous structure of the electrical terminals 42 and 44, thereby enhancing the physical integrity of the capacitor 40 and increasing its resistance to disassembly.

Likewise, as in the embodiment illustrated in FIG. 1, the above recited materials are preferred materials and other materials could be used without straying from the scope of the invention disclosed herein.

The thickness of electrical terminal pads 46, 48, 50 and 52, as discussed in the embodiment illustrated by FIG. 1, should be of sufficient thickness to provide a standoff distance from a substrate when the capacitor 40 is installed by surface mounting methods to facilitate flushing of contaminants from between the capacitor 40 and its associated substrate upon which it is mounted.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims.

I claim:

1. An improved metallized film capacitor configured for surface mounting to a substrate, said capacitor having a capacitive structure electrically terminated at a first end by a first electrical termination means and electrically terminated at a second end by a second electrical termination means, and said capacitor having at least one lateral face intermediate said first end and said second end; the improvement comprising extension of each said first and second electrical termination means from its respective of said first or second end onto said at least one lateral face, and in said extension providing sufficient thickness to said electrical termination means to establish a gap between said at least one lateral face and said substrate when said capacitor is surface mounted to said substrate; said surface mounting being effected by said electrical termination means and said gap being sufficient to facilitate cleaning contaminants from between said at least one lateral face and said substrate after said mounting; said first and second electrical termination means each being embeddedly bonded with said at least one lateral face and bonded with its respective of said first or second end to enhance physical integrity of the capacitor and to enhance the resistance of the capacitor to delamination.

2. An improved metallized film capacitor configured for surface mounting to a substrate as recited in claim 1 wherein said at least one metallic material comprises a second metallic and a third metallic material, said second metallic material being limited in a translateral dimension to be substantially coterminous with at least one lateral face.

3. An improved metallized film capacitor configured for surface mounting to a substrate as recited in claim 2 wherein said third metallic material is electrically connected to said second metallic material and extends onto said at least one lateral face.

4. An improved metallized film capacitor configured for surface mounting to a substrate as recited in claim 3 wherein said first and second metallic materials are aluminum and said third metallic material is copper.

5. An improved metallized film capacitor configured for surface mounting to a substrate as recited in claim 1 wherein said at least one lateral face is four lateral faces defining a top, a bottom, a first side and a second side of said capacitor; said extension of said electrical termination means occurring at said top and said bottom.

6. An improved metallized film capacitor configured for surface mounting to a substrate, said capacitor having a plurality of parallel plates; four lateral sides defining a top, a bottom, a first side, a second side; a first end, a second end, a first electrical termination means for electrically connecting a first group of said plurality of parallel plates at said first end, and a second electrical termination means for electrically connecting a second group of said plurality of parallel plates at said second end; the improvement comprising lateral electrical access means for facilitating electrical access to said first group and said second group of parallel plates; said lateral electrical access means comprising at least one electrically conductive solderable pad associated with each of said first and second electrical termination means, each of said pads being electrically connected to its respective electrical terminations means and extending onto at least one of said four lateral sides, and each of said pads having sufficient thickness to establish a gap between said substrate and the particular lateral side of said four lateral sides facing said substrate when said capictor is surface mounted to said substrate, said surface mounting being effected by two of said pads and said gap being sufficient to facilitate cleaning contaminants from between said particular lateral face and said substrate after said mounting; said lateral electrical access means such being embeddedly bonded with at least one of said four lateral sides and bonded with its respective electrical termination means to enhance physical integrity of the capacitor and to enhance the resistance of the capacitor to delamination 7. An improved metallized film capacitor configured for surface mounting to a substrate as recited in claim 6 wherein said at least one electrically conductive solderable pad associated with each of said first and second electrical termination means comprises two of said pads associated with each said first and second electrical termination means; one of said two pads extending onto said top and the other of said two pads extending onto said bottom of said capacitor for each of said first and second electrical termination means.

* * * * *